(12) United States Patent
Fillion et al.

(10) Patent No.: US 7,956,457 B2
(45) Date of Patent: Jun. 7, 2011

(54) SYSTEM AND APPARATUS FOR VENTING ELECTRONIC PACKAGES AND METHOD OF MAKING SAME

(75) Inventors: Raymond Albert Fillion, Niskayuna, NY (US); Kevin M. Durocher, Waterford, NY (US); Elizabeth A. Burke, Mechanicville, NY (US); Thomas Bert Gorczyca, Schenectady, NY (US); Charles G. Woychik, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 224 days.

(21) Appl. No.: 12/326,202

(22) Filed: Dec. 2, 2008

(65) Prior Publication Data

US 2010/0133683 A1 Jun. 3, 2010

(51) Int. Cl.
*H01L 23/34* (2006.01)

(52) U.S. Cl. ........... 257/712; 257/E23.002; 257/E23.08; 438/106; 438/108

(58) Field of Classification Search .................. 257/712, 257/E23.002, E23.08; 438/106, 107, 108
See application file for complete search history.

(56) References Cited

U.S. PATENT DOCUMENTS

| | | | |
|---|---|---|---|
| 5,353,195 A | 10/1994 | Fillion et al. | |
| 5,888,837 A | 3/1999 | Fillion et al. | |
| 5,946,546 A | 8/1999 | Fillion et al. | |
| 6,239,482 B1 | 5/2001 | Fillion et al. | |
| 6,242,282 B1 | 6/2001 | Fillion et al. | |
| 6,396,153 B2 | 5/2002 | Fillion et al. | |
| 7,329,958 B1* | 2/2008 | Shah et al. | 257/778 |
| 2002/0056911 A1* | 5/2002 | Iwaya et al. | 257/738 |
| 2007/0035688 A1* | 2/2007 | Matsuura | 349/149 |
| 2007/0132072 A1* | 6/2007 | Chang | 257/666 |
| 2008/0150159 A1* | 6/2008 | Aberin et al. | 257/778 |

* cited by examiner

*Primary Examiner* — Phuc T Dang
(74) *Attorney, Agent, or Firm* — Ziolkowski Patent Solutions Group, SC; Jean K. Testa

(57) ABSTRACT

An apparatus and method, the apparatus includes a substrate configured to support a plurality of dielectric layers, a device coupling area positioned in the substrate, and a plurality of gas exit apertures formed through the substrate. The plurality of gas exit apertures is configured to provide venting of at least one of moisture and outgassed material and the device coupling area is configured to receive an electronic device coupleable to the plurality of dielectric layers.

23 Claims, 3 Drawing Sheets

SYSTEM AND APPARATUS FOR VENTING ELECTRONIC PACKAGES AND METHOD OF MAKING SAME

BACKGROUND

Embodiments of the invention relate generally to integrated circuit (IC) packaging and, more particularly, to a method and apparatus for package fabrication that reduces chip and package failure due to outgassing.

A variety of approaches have been developed for fabricating IC packages (i.e., chips). One such approach is a embedded chip build-up (ECBU) packaging approach, in which a window frame structure is positioned about an IC element and coupled to one or more polymer films, with the one or more polymer films subsequently being electrically connected to the IC element and window frame structure by way of vias and metal interconnects. The window frame structure is mechanically rigid in nature and acts to control package flatness and stresses.

Existing window frame structures used in a ECBU packaging process can, however, lead to several challenges during fabrication. That is, moisture and other gasses may be released during build-up fabrication that can be trapped in the package. The moisture and other gasses can have a negative impact on the final product (i.e., the electronic package). For example, moisture can cause corrosion on package interconnects, thus effecting the reliability of the electronic package. Further, other gasses that are outgassed can fall and condense onto a dielectric layer of a package during fabrication potentially degrading the integrity of the package.

As fabrication continues, this moisture, along with other materials that may be outgassed, may then become trapped between dielectric and other layers of an electronic package. During fabrication, testing, or use, such trapped moisture or outgassed material can cause these layers to delaminate from the surface to which they are adhered. For example, when modules are exposed to high moisture and then exposed to solder reflow temperatures such as two hundred and twenty degrees Celsius for eutectic Sn:PB or two hundred and sixty for lead-free solders, trapped moisture can turn gaseous, apply pressure within a build-up interconnect structure, and create a de-lamination site that may lead to module failure. With smaller modules (e.g., modules that are ten to twenty millimeters square or less), the maximum distance moisture generally needs to travel to escape is often only a few millimeters, such as two to five millimeters. However, as a package (i.e., a module) grows to forty to sixty millimeters square, the maximum travel distance of moisture can increase to fifteen to twenty millimeters or more. Accordingly, the area on a chip that may trap moisture also increases as the package size increases. The longer paths and their increased areas of trapping can greatly increase the forces that cause de-lamination.

As such, it may be desirable to have a system that has aspects and features that differ from those that are currently available and that solves at least the aforementioned problems. Further, it may be desirable to have a method that differs from those methods that are currently available.

BRIEF DESCRIPTION OF THE INVENTION

Aspects of the invention provide an apparatus that includes a substrate configured to support a plurality of dielectric layers, a device coupling area positioned in the substrate, and a plurality of gas exit apertures formed through the substrate. The plurality of gas exit apertures is configured to provide venting of at least one of moisture and outgassed material and the device coupling area is configured to receive an electronic device coupleable to the plurality of dielectric layers. Aspects of the invention also provide an electronic device package including at least one interconnection layer, at least one electronic device element coupled to the at least one interconnection layer, a stiffener including a substrate and coupled to the at least one interconnection layer, and a pattern of electrical conductors formed in the at least one interconnection layer and configured to electrically connect the at least one interconnection layer to the at least one electronic device element. The substrate includes at least one device area formed therein and a plurality of vent apertures extending therethrough. The plurality of vent apertures is configured to facilitate the exit of at least one of a gaseous material and a moisture and the at least one device area is configured to receive the at least one electronic device element therein.

Aspects of the invention also provide a method including providing a package stiffener having a die area configured to receive a die and having a plurality of vent apertures formed therein, attaching the plurality of electronic package layers to the package stiffener, attaching the die to the plurality of electronic package layers, and forming electrically conductive paths in the plurality of electronic package layers. The plurality of vent apertures is configured to provide an exit passage for at least one of moisture and materials outgassed from a plurality of electronic package layers.

Various other features may be apparent from the following detailed description and the drawings.

BRIEF DESCRIPTION OF THE DRAWINGS

The drawings illustrate at least one preferred embodiment presently contemplated for carrying out the invention.

In the drawings.

DETAILED DESCRIPTION

The invention includes embodiments that relate to stiffeners used to provide support for electronic package layers. Embodiments of the invention may be implemented in electronic packages fabricated using a wide variety of fabrication technologies. For example, embodiments of the invention may be implemented in electronic packages fabricated using build-up technologies such as embedded chip or flip-chip technologies or printed circuit technologies.

Figure 1:
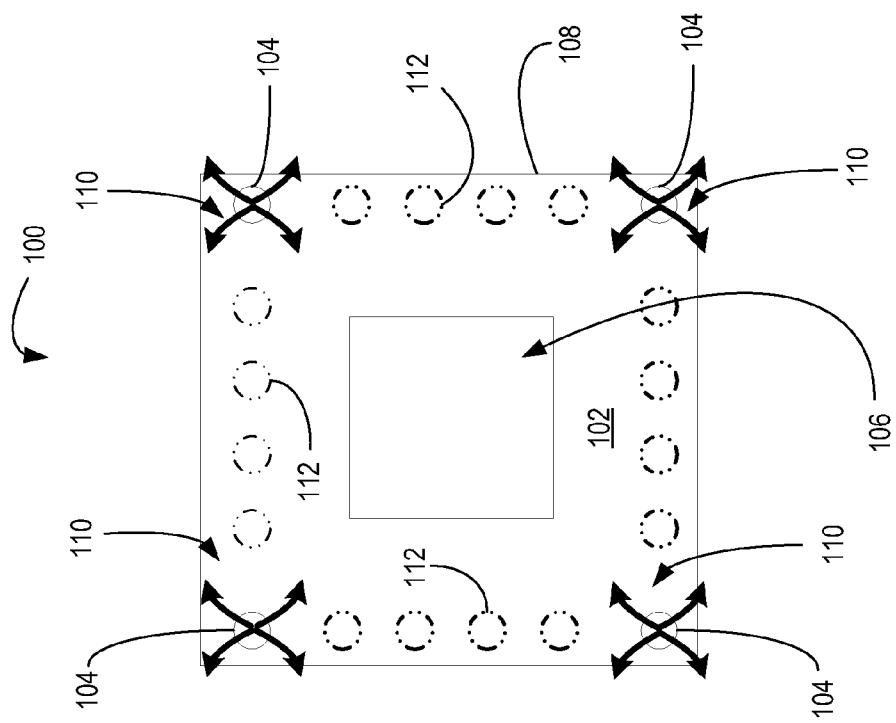
FIG. 1 is a schematic block diagram of an electronic package stiffener according to an embodiment of the invention.

Referring to FIG. 1, a schematic block diagram of a package stiffener 100 is shown according to an embodiment of the invention and includes a substrate 102 having a plurality of vent apertures 104 formed therein, a device or die coupling area 106, and an outer perimeter 108. As will be described in greater detail below with respect to FIGS. 3-5, stiffener 100 is configured to support a plurality of interconnect or dielectric layers of an electronic package. Substrate 102 of stiffener 100 may be formed from of a variety of materials. For example, the material constituents of stiffener substrate 102 may include one or more metals such as titanium, aluminum, stainless steel, and nickel plated copper. In addition, or in the alternative, the constituent materials of stiffener substrate 102 may also include one or more nonmetals such as a polymeric material (e.g., an epoxy or polyimide). Preferably, stiffener substrate 102 also includes filler material such as fiberglass fibers or inorganic particles of silicon carbide, silica, or ceramic.

In the present embodiment, four vent apertures 104 through stiffener 100 are shown surrounding device area 106. Vent apertures 104 are configured to facilitate the exit of moisture and/or gaseous material. As understood by those skilled in the art, moisture or outgassed materials present during package fabrication and/or testing may result in chip or package failure or may affect chip or package reliability. To address such potential failure and reliability problems, vent apertures 104 provide an exit for moisture or outgassed materials so that the moisture or outgassed material does not become embedded or affixed onto or into the package during fabrication, testing, and/or use. That is, vent apertures 104 allow outgassed materials and moisture to pass away from stiffener 100 or other layers of the package (not shown). Not only do vent apertures 104 provide an exit for outgassed materials and/or moisture, vent apertures 104 can also provide a passageway for airflow 110 therethrough, thus allowing outgassed materials and/or moisture to be removed from a surface of a chip by convection. Accordingly, vent apertures 104 decrease the quantity of outgassed materials and/or moisture that may become embedded in electronic package or on the electronic chip. As such, chip and package reliability increases since corrosion and/or de-lamination that may be caused by moisture and/or outgassing is reduced.

Though only four vent apertures 104 are shown in the present embodiment, it is contemplated, as shown in phantom, that package stiffener 100 may include additional vent apertures 112 therethrough. It is also contemplated that stiffener 100 may include less than the four vent apertures 104 shown.

Figure 3:
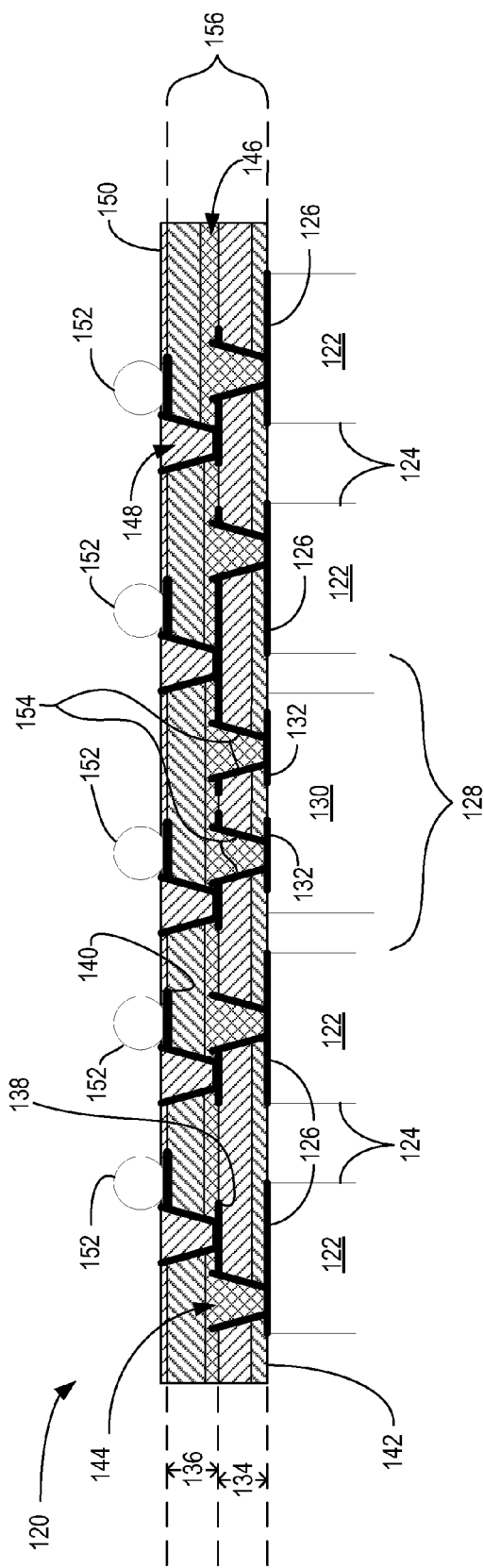
FIG. 3 is a cross-sectional view of an electronic package having a package stiffener with vent apertures according to an embodiment of the invention.
Figure 4:
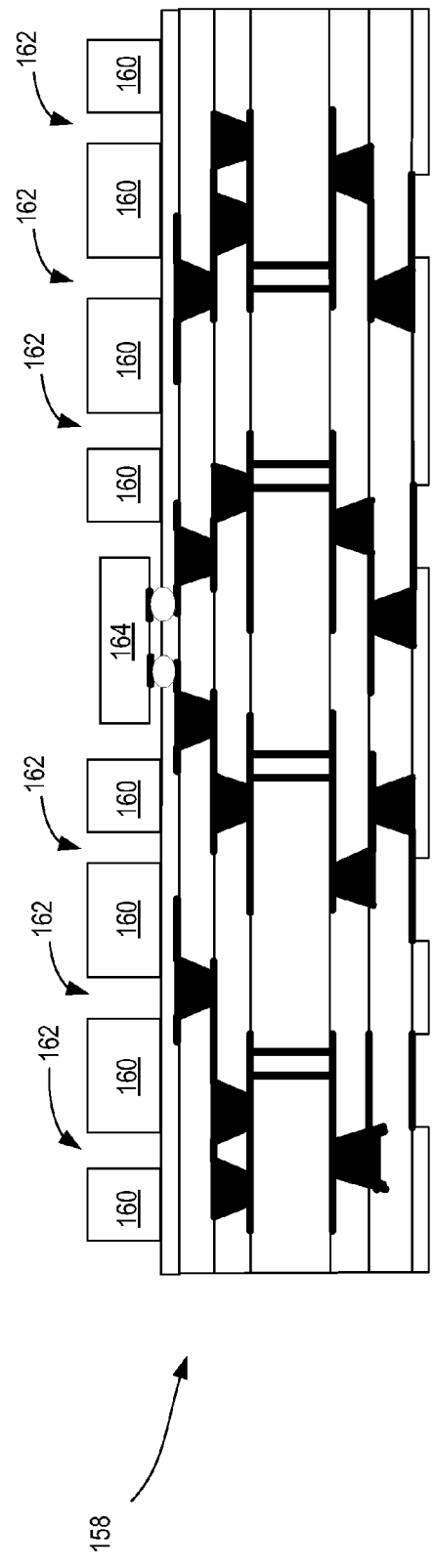
FIG. 4 is a cross-sectional view of another electronic package having a package stiffener with vent apertures according to another embodiment of the invention.
Figure 5:
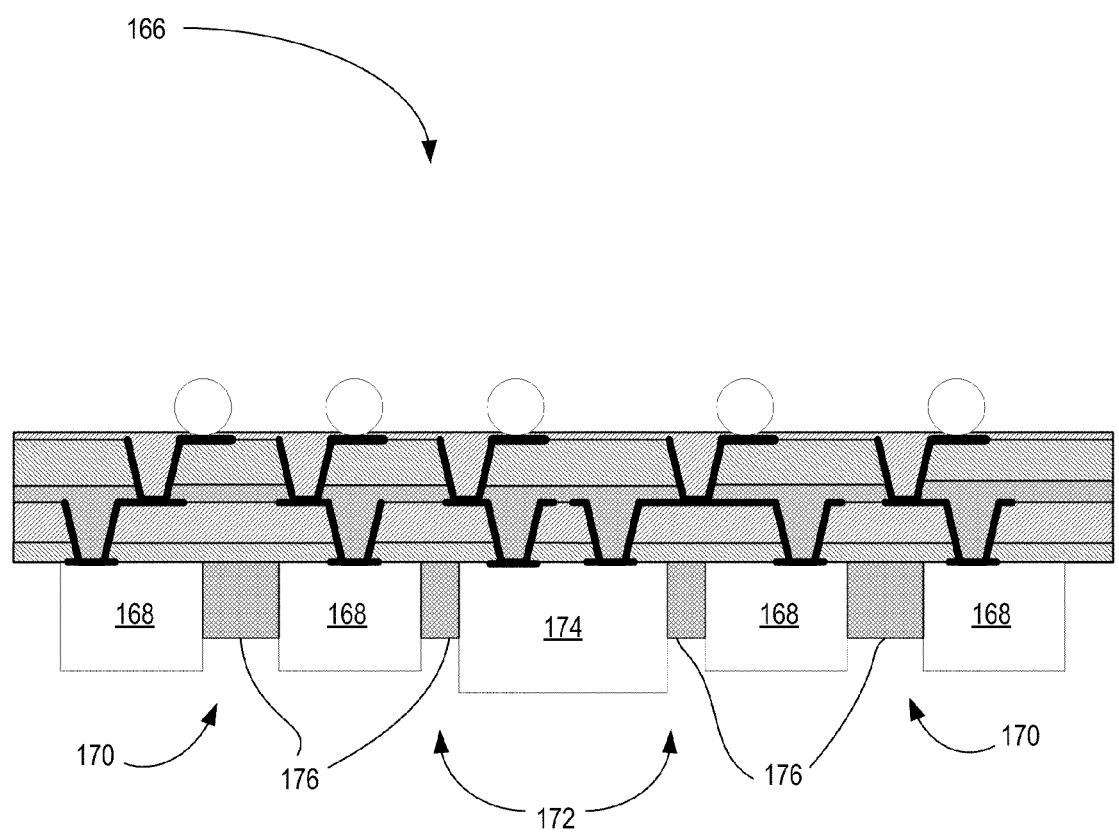
FIG. 5 is a cross-sectional view of an electronic package having a package stiffener with vent apertures filled with a filler according to an embodiment of the invention.

As will be shown in greater detail with respect to FIGS. 3-5, device coupling area 106 is an area or region where an electronic device or element (not shown) may be positioned so that it may be coupled to the electronic package. It is contemplated that device coupling area 106 may be an aperture formed through substrate 102, a housing formed on substrate 102, or an indentation formed in substrate 102.

Figure 2:
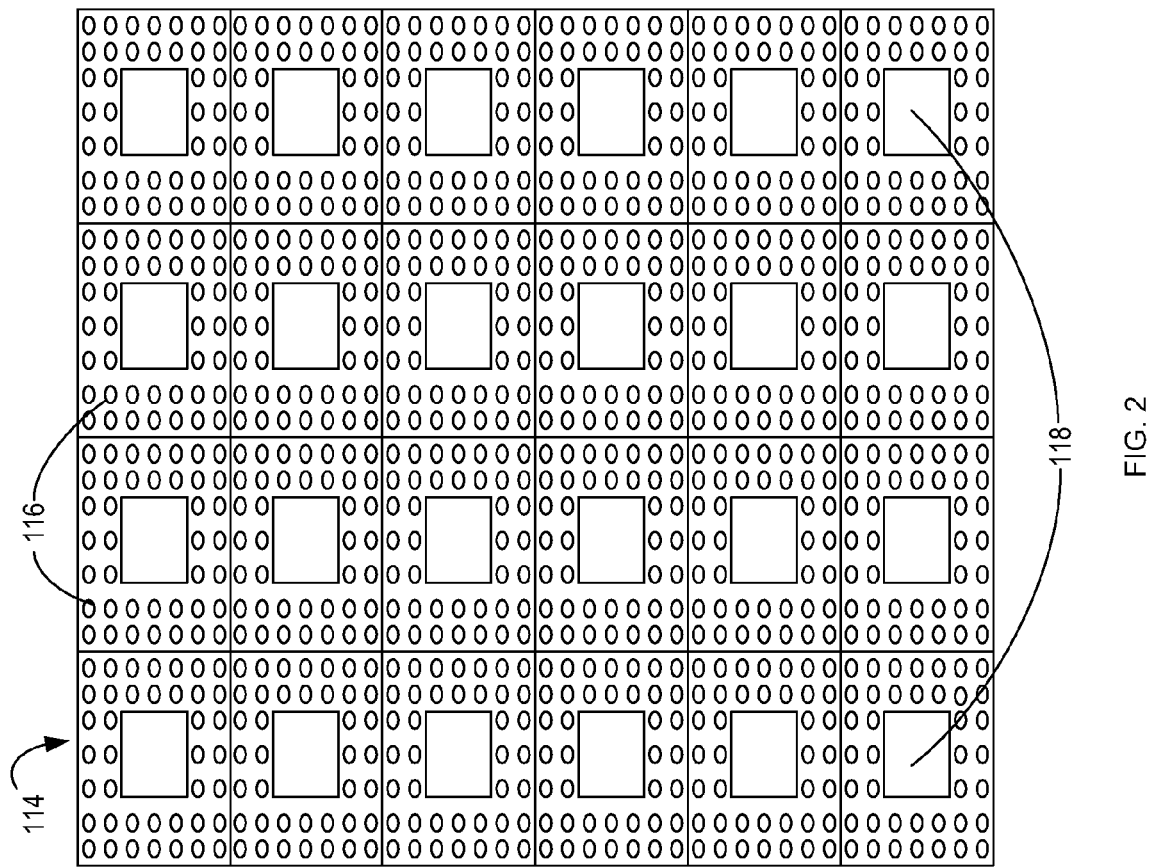
FIG. 2 is another schematic block diagram of an electronic package stiffener according to an embodiment of the invention.

Referring to FIG. 2, a schematic block diagram of a package stiffener 114 having a plurality of gas exit apertures 116 (i.e., vent apertures) formed therethrough and positioned around a plurality of device coupling areas 118 is shown according to an embodiment of the invention. Each device coupling area 118 provides a region where at least one electronic device (not shown) may be positioned for coupling to the electronic package (not shown). As with vent apertures 104 of FIG. 1, gas exit apertures 116 of FIG. 2 provide passages for outgassed materials and/or moisture to exit therethrough, and convective airflow. In the embodiment of FIG. 2, apertures 116 are shown formed/arranged about each of the device coupling areas 118 in a rectangular matrix array or pattern. It is contemplated, however, that apertures 116 may arranged in patterns other than that shown in FIG. 2.

Referring now to FIG. 3, a cross-sectional view of an electronic package 120 having a stiffener 122 with a plurality of vent apertures 124 therethrough is shown in a according to an embodiment of the invention. As shown, stiffener 122 of electronic package 120 has a ground plane 126 coupled thereto and also includes a device coupling area 128 where a die or electronic device element 130 is positionable therein as shown. In the present embodiment, device area or device coupling area 128 is a device aperture through stiffener 122, and electronic device 130 is positioned therein such that device aperture 128 at least partially surrounds electronic device 130. Electronic device 130 may be, for example, a semiconductor chip or a microelectromechanical systems (MEMS) device. In the present embodiment, electronic device 130 has a set of electrically conductive pads 132 (i.e., device pads) formed thereon.

In the embodiment shown, electronic package 120 having stiffener 122 includes a plurality of dielectric layers, which includes a bottom dielectric layer 134 and a top dielectric layer 136, and a plurality first-layer electrical connections 138 and second-layer electrical connections 140 (e.g., input/output (I/O) pads) for transmitting electrical energy or electrical signals.

In one embodiment, electronic package 120 is an embedded chip package. In such an embodiment, fabrication may begin with stiffener 122 being adhered to an adhesive sub-layer 142 of bottom dielectric layer 134. Die or electronic device 130 may subsequently be adhered to adhesive sub-layer 142. Next, a plurality of first layer vias 144 may then be formed into bottom dielectric layer 134 followed by metallization such that electrically conductive paths are formed from ground plane 126 and from device pads 132 to first-layer connections 138. Following the metallization, an adhesive sub-layer 146 of top dielectric layer 136 may then be adhered to bottom dielectric layer 134 and first-layer connections 138. A set of second-layer vias 148 is then formed in top dielectric layer 136. Second-layer vias 148 are then metalized such that the electrically conductive paths proceed to second-layer connections 140. A third dielectric layer 150 may then be adhered to top dielectric layer 136. Third dielectric layer 150 may serve as a passivation and/or a solder mask layer on the top surface of electronic package 120. It is contemplated that additional layers (not shown) may also be added. Finally, in the embodiment shown, a set of solder reflow balls 152 is adhered to second-layer electrical connections 140 of electronic package 120. During fabrication, testing, or use, any moisture or outgassed material that is generated during such steps can readily migrate towards vent apertures 124 and may pass through vent apertures 124 and exit away from electronic package 120. As such, chip or package failure due to de-lamination or corrosion may be reduced.

In the embodiment described above, stiffener 122 having vent apertures 124 is adhered to bottom dielectric layer 134 before first-layer vias 144 are formed. However, it is contemplated that stiffener 122 may be adhered to bottom layer 134 at any time during fabrication. For example, stiffener 122 may be adhered to bottom dielectric layer 134 after second dielectric layer 136 is adhered, but before solder reflow balls 152 are adhered to second-layer electrical connections 140. That is, stiffener 122 may be adhered to bottom dielectric layer 134 after region 156 (e.g., a laminate layer stack) is fabricated or built-up. In yet another embodiment, stiffener 122 may be adhered to bottom dielectric layer 134 after solder reflow balls 152 are adhered to second-layer electrical connections 140, but before testing. The embodiments described with respect to FIG. 3 are exemplary. That is, it is contemplated that an embedded chip other than that shown in FIG. 3 may use stiffeners having vent apertures according to embodiments of the invention.

Referring to FIG. 4, a cross-sectional view of an electronic package 158 having a stiffener 160 with a plurality of vent apertures 162 therethrough is shown according to another embodiment of the invention. Electronic package 158 shown in the present embodiment is a flip-chip type of electronic package and has an electronic flip-chip device 164 coupled thereto. As with other embodiments, vent apertures 162 of stiffener 160 help to reduce the accumulation of outgassed material or moisture on electronic chip 158 during chip fabrication, testing, and/or use.

Embodiments of the stiffener have been described in conjunction with electronic packages developed or fabricated using embedded chip and flip-chip technology. It is contemplated, however, that a stiffener having vent apertures can be effectively used with other electronic chips that implement fabrication technologies other than embedded chip or flip-chip technology. For example, according to another embodiment, the stiffener having the vent apertures therethrough may be effectively incorporated into electronic packages fabricated using printed circuit technology.

Referring to FIG. 5, a cross-sectional view of an electronic package 166 having a stiffener 168 with a plurality of vent apertures 170 formed therein is shown according to another embodiment of the invention. As shown in the present embodiment, vent apertures 170 as well as gaps 172 between electronic device 174 and stiffener 168 may be filled with a filler 176 such as an epoxy, a silicone, or other encapsulant to provide stress relief to electronic device 174 and to electronic package 166. A liquid dispense tool (not shown) could be used to dispense filler 176. Other filler 176 materials may include aliphatic and aromatic polymers including thermoplastic and thermoset type polymers. Further, filler 176 material may also include blends of various polymers such as polyetherimide resins, acrulates, polyurethanes, polytetrafluoroethylenes, epoxies, benzocyclobutene (BCB), and polyimides. Still further, filler 176 may also include other polymers that include an inorganic material in a configuration of particles or fibers composed of materials such as glass, silica, or ceramic.

Preferably, encapsulant or filler 176 includes a blend of 50 g SPI-135 solution (a siloxane-polyimide available from MicroSi), with 50 g of a cycloaliphatic epoxy that contains 1% by weight of an onium salt crosslinking catalyst. Filler 176 is cured to a substantially solid state after its application. In certain embodiments, it may be beneficial to simultaneously cure encapsulant 176 and adhesive sub-layer 142.

According to an embodiment of the invention, an apparatus includes a substrate configured to support a plurality of dielectric layers, a device coupling area positioned in the substrate, and a plurality of gas exit apertures formed through the substrate. The plurality of gas exit apertures is configured to provide venting of at least one of moisture and outgassed material and the device coupling area is configured to receive an electronic device coupleable to the plurality of dielectric layers.

According to another embodiment of the invention, an electronic device package includes at least one interconnection layer, at least one electronic device element coupled to the at least one interconnection layer, a stiffener including a substrate and coupled to the at least one interconnection layer, and a pattern of electrical conductors formed in the at least one interconnection layer and configured to electrically connect the at least one interconnection layer to the at least one electronic device element. The substrate includes at least one device area formed therein and a plurality of vent apertures extending therethrough. The plurality of vent apertures is configured to facilitate the exit of at least one of a gaseous material and a moisture and the at least one device area is configured to receive the at least one electronic device element therein.

According to yet another embodiment of the invention, a method includes providing a package stiffener having a die area configured to receive a die and having a plurality of vent apertures formed therein, attaching the plurality of electronic package layers to the package stiffener, attaching the die to the plurality of electronic package layers, and forming electrically conductive paths in the plurality of electronic package layers. The plurality of vent apertures is configured to provide an exit passage for at least one of moisture and materials outgassed from a plurality of electronic package layers.

The invention has been described in terms of the preferred embodiment, and it is recognized that equivalents, alternatives, and modifications, aside from those expressly stated, are possible and within the scope of the appending claims.

What is claimed is:

1. An apparatus comprising:
a stiffener configured to support a plurality of dielectric layers;
a device coupling area positioned in the stiffener, wherein the device coupling area is configured to receive an electronic device coupleable to the plurality of dielectric layers; and
a plurality of gas exit apertures formed through the stiffener, wherein each of the plurality of gas exit apertures is configured to provide venting of at least one of moisture and outgassed material therethrough.

2. The apparatus of claim 1 further comprising a filler adhered to each of the plurality of gas exit apertures and configured to fill a void within each gas exit aperture.

3. The apparatus of claim 1 further comprising a ground plane coupled to the substrate.

4. The apparatus of claim 1 further comprising the plurality of dielectric layers, wherein the plurality of electronic chip layers are build-up electronic chip layers.

5. An electronic device package comprising:
at least one interconnection layer;
at least one electronic device element coupled to the at least one interconnection layer;
a stiffener coupled to the at least one interconnection layer and comprising a substrate comprising:
at least one device area formed in the substrate and configured to receive the at least one electronic device element therein; and
a plurality of vent apertures extending through the substrate, the plurality of vent apertures configured to facilitate the exit of at least one of a gaseous material and a moisture; and
a pattern of electrical conductors formed in the at least one interconnection layer and configured to electrically connect the at least one interconnection layer to the at least one electronic device element.

6. The electronic device package of claim 5 wherein each device area comprises a device aperture extending through the substrate, the device aperture configured to at least partially surround the device element.

7. The electronic device package of claim 5 wherein each of the plurality of vent apertures has an aperture area that is less an area of each device area.

8. The electronic device package of claim 7 wherein the plurality of vent apertures are arranged in a rectangular matrix array.

9. The electronic device package of claim 5 wherein each device area comprises a device depression configured to receive a respective device element therein, and wherein each of the plurality of vent apertures has an aperture area that is less than an area of each device depression.

10. The electronic device package of claim 5 wherein the stiffener comprises at least one of titanium, aluminum, ceramic, stainless steel, and nickel plated copper.

11. The electronic device package of claim 5 wherein the stiffener comprises a polymeric material.

12. The electronic device package of claim 5 further comprising an electrically conductive reference plane coupled to the stiffener.

13. The electronic device package of claim 5 wherein the plurality of interconnection layers are embedded chip electronic package layers.

14. The electronic device package of claim 5 wherein the plurality of interconnection layers are flip-chip electronic package layers.

15. A method of forming an electronic device package comprising:
   providing a package stiffener having a die area configured to receive a die, the package stiffener having a plurality of vent apertures formed therein, wherein the plurality of vent apertures is configured to provide an exit passage for at least one of moisture and materials outgassed from a plurality of electronic package layers;
   attaching the plurality of electronic package layers to the package stiffener;
   attaching the die to the plurality of electronic package layers; and
   forming electrically conductive paths in the plurality of electronic package layers.

16. The method of claim 15 further comprising building up the plurality of electronic package layers through one of a flip-chip build-up process and an embedded chip build-up process.

17. The method of claim 15 further comprising forming the plurality of electronic package layers according to a printed circuit chip technique.

18. The method of claim 15 further comprising reflow soldering an outside region of the plurality of electronic package layers.

19. The method of claim 18 wherein attaching the plurality of electronic package layers to the package stiffener comprises attaching the plurality of electronic package layers to the package stiffener before reflow soldering the outside region.

20. The method of claim 18 further comprising filling the plurality of vent apertures with a filler after reflow soldering the outside region.

21. The method of claim 20 further comprising curing the filler to a substantially solid state.

22. The method of claim 15 further comprising:
   pre-patterning the plurality of electronic package layers; and
   laminating the pre-patterned plurality of electronic package layers together to form a laminate layer stack before attaching the plurality of electronic package layers to the package stiffener.

23. An apparatus comprising:
   a stiffener configured to support a plurality of dielectric layers;
   a device coupling area positioned in the stiffener, wherein the device coupling area is configured to receive an electronic device coupleable to the plurality of dielectric layers;
   a plurality of gas exit apertures formed through the stiffener, wherein each of the plurality of gas exit apertures is configured to provide venting of at least one of moisture and outgassed material therethrough; and
   a filler adhered to each of the plurality of gas exit apertures and configured to fill a void within each gas exit aperture.

* * * * *